(12) United States Patent
Iida et al.

(10) Patent No.: US 6,277,545 B1
(45) Date of Patent: Aug. 21, 2001

(54) METHOD OF MANUFACTURING OPTICAL DISC MASTER PLATE

(75) Inventors: Tetsuya Iida; Takanobu Higuchi; Osamu Kasono, all of Saitama-ken (JP)

(73) Assignee: Pioneer Electronic Corporation, Tokyo (JP)

( * ) Notice: Subject to any disclaimer, the term of this patent is extended or adjusted under 35 U.S.C. 154(b) by 0 days.

(21) Appl. No.: 09/231,904

(22) Filed: Jan. 14, 1999

(30) Foreign Application Priority Data

Jan. 14, 1998 (JP) .................................................. 10-017802

(51) Int. Cl.$^7$ .................................................. G11B 7/135
(52) U.S. Cl. .......................... 430/320; 430/321; 430/945; 430/271.1; 430/273.1; 369/112; 351/508; 351/664
(58) Field of Search ................................ 430/271.1, 277.1, 430/320, 321, 945; 369/112; 351/508, 664

(56) References Cited

U.S. PATENT DOCUMENTS

| | | | |
|---|---|---|---|
| 4,150,398 | * | 4/1979 | Kojima et al. .................. 430/945 |
| 5,121,256 | * | 6/1992 | Corle et al. ..................... 359/664 |

FOREIGN PATENT DOCUMENTS

| | | | |
|---|---|---|---|
| 0555583 | * | 8/1993 | (EP) . |
| 6-243512 | * | 9/1994 | (JP) . |
| 7-248604 | * | 9/1995 | (JP) . |

* cited by examiner

Primary Examiner—Martin Angebranndt
(74) Attorney, Agent, or Firm—Arent Fox Kintner Plotkin & Kahn, PLLC

(57) ABSTRACT

A method of manufacturing an optical disc master plate, comprises the steps of: forming a photoresist layer having an electrically conductivity on a substrate; and irradiating the photoresist layer with a laser beam, using an optical system capable of holding a solid immersion lens on a flying head.

5 Claims, 9 Drawing Sheets

METHOD OF MANUFACTURING OPTICAL DISC MASTER PLATE

BACKGROUND OF THE INVENTION

The present invention relates to a method of manufacturing an optical disc master plate, particularly to a method of manufacturing an optical disc master plate employing a SIL (Solid Immersion Lens).

FIG. 7 is an explanatory view illustrating some important steps involved in a conventional method for manufacturing an optical disc master plate with the use of an SIL.

Referring to FIG. 7a, a glass substrate 1 having a predetermined configuration is first coated with an organic Primer such as HMDS (Hexamethyl Di-silazane), and is then spin-coated with a photoresist material dissolved in a solvent, so as to form a predetermined photoresist layer 2 tightly adhered to the surface of the glass substrate 1.

Subsequently, the solvent is removed by virtue of evaporation. Then, a clean oven is used to pre-bake the glass substrate 1 together with the photoresist layer 2, thereby forming a stabilized photoresist layer 2 on the glass substrate 1.

FIG. 8 illustrates a function of an optical system within a recording head. As shown in FIG. 8, a recording beam L modulated in accordance with the information to be recorded is directed so as to pass through an objective lens 5. Thus, the recording beam L is converged, and is then collected on substantially the center of the emitting surface of the SIL 4. If the SIL 4 is a super spherical lens, an equivalent NA (Numerical Aperture) of an optical system using the SIL 4 may be indicated by the following equation.

$$NA = n^2 \times NA$$

Here, n is index of refraction of SIL 4. Therefore, a diameter L of the beam spot of the recording beam may be represented in the following equation, where $\lambda$ is wavelength of the recording beam.

$$L = \lambda/(n^2 \times NA)$$

Subsequently, in an exposure treatment shown in FIG. 7b, a small interval (having a width which is 1/10–1/4 of the wavelength $\lambda$ of the recording beam) is formed between the SIL 4 and the photoresist layer 2, by virtue of a flying head 3 and an air flow induced by the rotation of the master disc plate. When a light beam exiting from the SIL 4 has a diameter D1 (FIG. 9) and the above small interval is less than 1/4 of the wavelength $\lambda$ of the recording beam, a beam spot on the photoresist layer 2 will also has a diameter of D1.

In this way, recording beam L converged by an objective lens 5 is further converged by SIL 4, and is caused to irradiate the photoresist layer 2 on the glass substrate 1, so that information may be recorded by cutting pits spirally thereon.

After that, referring to FIG. 7c, a developing process is conducted, thereby obtaining an optical disc master plate on which a plurality of pits are formed in a spiral array.

However, when employing a pit cutting device using the SIL 4, since the SIL 4 serves to perform a near field recording (near the photoresist layer 2), it is necessary that the interval between the light exiting surface of the SIL 4 and the photoresist layer 2 of the glass substrate 1 be constantly kept at a width which is 1/4 of the wavelength $\lambda$ of the recording beam.

In this manner, once the photoresist layer 2 of the glass substrate 1 bears a static electricity, a force caused due to such static electricity will act between the SIL 4 and the photoresist layer 2. As a result, it is difficult to stably keep the above interval between the light exiting surface of the SIL 4 and the photoresist layer 2 of the glass substrate 1. Moreover, dust or small rubbish will adhere to the photoresist layer 2, causing a collision between the SIL 4 and the dust or small rubbish attached on the photoresist layer 2, making it difficult or even impossible to perform a predetermined information recording.

SUMMARY OF THE INVENTION

It is an object of the present invention to provide an improved method for manufacturing an optical disc master plate having antistatic property and a high recording density, so as to solve the above-mentioned problems peculiar to the above-mentioned prior arts.

According to the present invention, there is provided a method of manufacturing an optical disc master plate, comprising the steps of: forming a photoresist layer having an electrically conductivity on a substrate; and irradiating the photoresist layer with a laser beam, using an optical system capable of holding a solid immersion lens on a flying head.

In one aspect of the present invention, the photoresist layer is formed by a photoresist material containing an electrically conductive material or an antistatic agent.

In another aspect of the present invention, a method of manufacturing an optical disc master plate, comprises the steps of: forming a photoresist layer having an electrically conductivity on a substrate; coating the photoresist layer with an electrically conductive material or an antistatic agent; and irradiating the photoresist layer with a laser beam, using an optical system capable of holding a solid immersion lens on a flying head.

In a further aspect of the present invention, a method of manufacturing an optical disc master plate, comprises the steps of: forming a photoresist layer on a substrate; forming on the photoresist layer a photobleachable dye layer having a predetermined electrical conductivity; irradiating the photoresist layer with a laser beam, using an optical system capable of holding a solid immersion lens on a flying head.

In a still further aspect of the present invention, the photobleachable dye layer is formed by a photobleachable material containing an electrically conductive material or an antistatic agent.

In one more aspect of the present invention, the photobleachable material layer has a volume inherent resistance which is less than 10 $\Omega$cm.

In still one more aspect of the present invention, a method of manufacturing an optical disc master plate, comprises the steps of: forming a photoresist layer on a substrate; forming a photobleachable dye layer on the photoresist layer; coating the photobleachable dye layer with an electrically conductive material or an antistatic agent; and irradiating the photoresist layer with a laser beam, using an optical system capable of holding a solid immersion lens on a flying head.

The above objects and features of the present invention will become better understood from the following description with reference to the accompanying drawings.

DETAILED DESCRIPTION OF THE PREFERRED EMBODIMENTS

Figure 1:
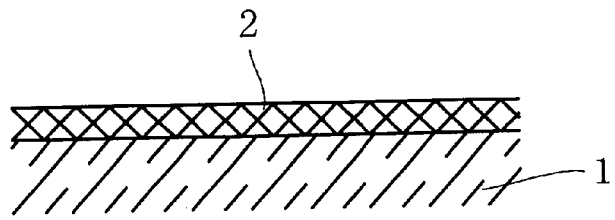
FIGS. 1a–1d are explanatory views indicating several important steps of a method for manufacturing an optical disc master plate, according to a first embodiment of the present invention.
Figure 1:
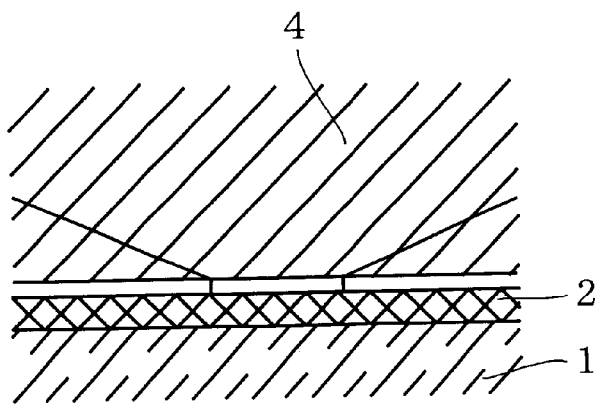
Figure 1:
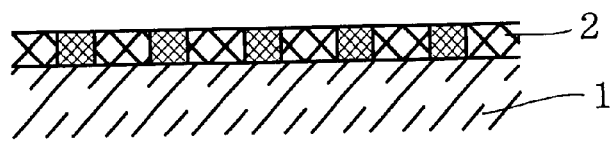
Figure 1:
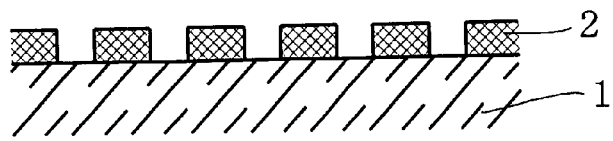

A first embodiment of a method for manufacturing an optical disc master plate will be described with reference to FIGS. 1–3.

Prior to starting a manufacturing process shown in FIG. 1, a glass substrate 1 is selected and treated in the following manner.

What is used as a glass substrate may be an optical glass, a reinforced glass or a soda lime glass. However, it is also possible to replace the glass substrate with a silicon substrate or an aluminium substrate.

After a glass substrate or a substrate of other material is formed into a disc shape, it is necessary to check an inner diameter, outer diameter, thickness, circularity, concentricity, flatness, degree of parallelizability, bubbles, flaws, chips, etc.

Then, the glass substrate 1 is polished so as to remove some fine surface flaws and activate the surface of the substrate.

Subsequently, in order to remove glass powder and other small grains, the above glass substrate is washed in a scrubber with the use of a super pure water, and is then dried in a spin drying manner.

After this, a manufacturing process for making an optical disc master plate may be started with a step shown in FIG. 1a.

FIG. 1a shows a condition where a photoresist layer 2 is formed on the glass substrate 1. In order to obtain a strong adhesion between the glass substrate 1 and the photoresist layer 2, a glass substrate 1 having a predetermined configuration is first coated with an organic primer such as HMDS (Hexamethyl Di-silazane), and is then spin-coated with a photoresist material dissolved in a solvent. Subsequently, the solvent is removed by virtue of evaporation, a clean oven is used to pre-bake the glass substrate 1 together with the photoresist layer 2, thereby obtaining a stabilized photoresist layer 2 on the glass substrate 1.

Since a thickness of the photoresist layer 2 will have a direct effect on the height and configuration of an optical disc, it is very important to properly perform a precise management of such thickness so as to ensure a good quality for the disc.

Therefore, an ellipsometry method having a high sensibility but working in a non-contact and non-destructive manner, is used to measure the thickness of the photoresist layer 2 to check if such thickness is in a predetermined scope.

In order to cause a desired leakage of the static electricity on the photoresist layer 2, an electrically conductive material serving as a conductive filler, such as a carbon black or a black lead, is added in the photoresist layer 2 so as to provide a desired electric conductivity for the photoresist layer 2. Alternatively, it is also possible to add a metallic conductive filler such as a silver powder in the photoresist layer 2. Further, an electrically conductive filler may also be a fiber or a powder of aluminium, brass, stainless steel, or a carbon fiber. Each of these electrically conductive fillers is required to have a volume inherent resistance of less than $10^{11}$ $\Omega$cm.

On the other hand, the photoresist layer 2 may contain an antistatic agent such as non-ionic N,N-bisalkylamine, polyoxyethylene alkylamine, fatty acid aster of polyoxyethylene alkylamine, glycerine fatty acid ester, sorbithane fatty acid ester, polyoxyethylene sorbithane fatty acid ester, polyoxyethylene fatty alcohol ether, polyoxyethylene alkylphenyl ether, polyethylene glycol fatty acid ester.

Further, what can be used as an antistatic agent also includes an anionic substance such as alkylsulfonate, alkylbenzene sulfonate, alkylsulfate, a cathionic substance such as alkylphosphate, tetraalkyl ammonium salt, an anionic/cathionic substance such as trialkylbenzene ammonium salt, alkylbetaine, imidazoline.

However, when forming the photoresist layer 2, it is allowed not to add the above electrically conductive filler or anti-static agent in the photoresist layer 2, instead, the electrically conductive filler or anti-static agent may be applied to the surface of photoresist layer 2 after the formation of the photoresistor layer 2, in the same manner as in a prior art.

Under this condition, although the photoresist layer 2 does not have an electric conductivity, the surface of the photoresist layer 2 is coated with a layer of a conductive filler or a layer of anti-static agent in the vicinity of SIL 4. Moreover, it is also possible that the photoresist layer 2 itself may be made of an electrically conductive material.

Figure 2:
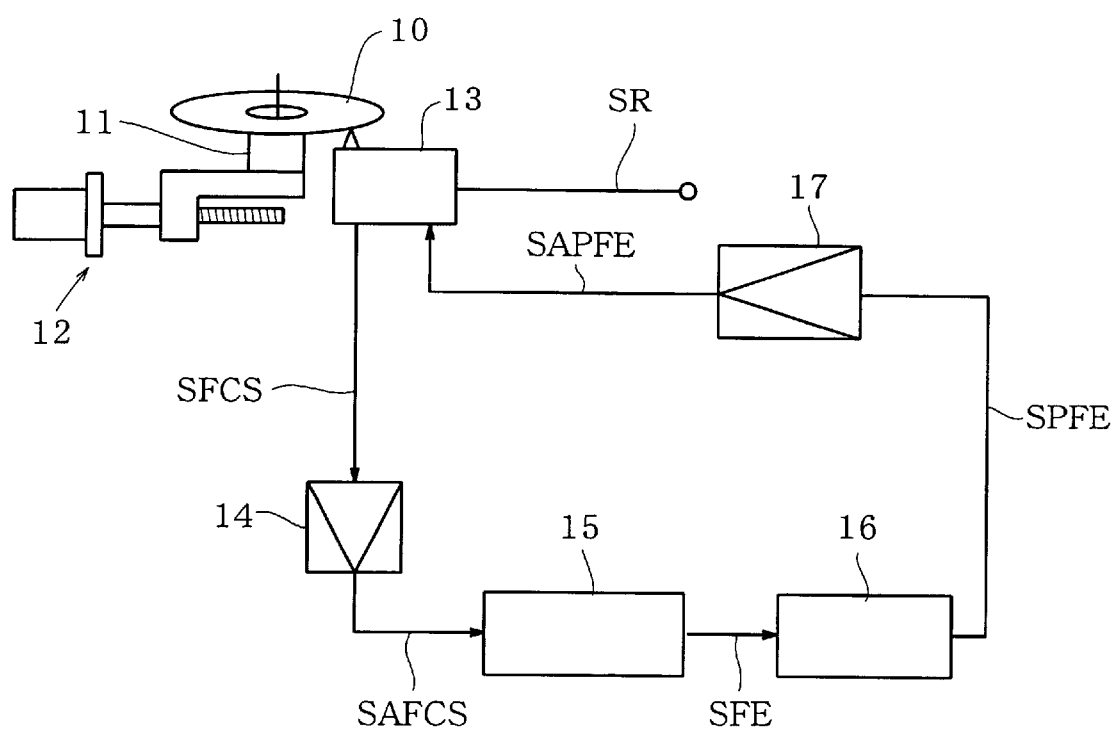
FIG. 2 is a block diagram indicating a recording system for manufacturing an optical disc master plate.

FIG. 2 is a block diagram indicating a recording system for manufacturing an optical disc master plate.

Referring to FIG. 2, the recording system comprises a motor 11 for driving an optical disc master plate 10 including a glass substrate 1 and the photoresist layer 2, a sending device for sending the motor 11 in the radial direction of the glass substrate 1, a recording head 13, a bead amplifier 14, a focus matrix circuit 15, a phase compensation circuit 16 and an amplifier 17. The recording bead 13 is adapted to receive a recording signal SR from an external circuit (not shown), an amplified phase compensation focus error signal SAPFE from an amplifier 17, and produce a focus servo signal SFCS. The head amplifier 14 is adapted to amplify the focus servo signal SFCS so as to produce an amplified focus servo signal SAFCS. The focus matrix circuit 15 is adapted to produce a focus error signal SFE in accordance with the amplified focus servo signal SAFC. The phase compensation circuit 16 is adapted to compensate the phase of the focus error signal SFE so as to produce a phase-compensated focus error signal SPFE. The amplifier 17 is adapted to amplify the phase-compensated focus error signal SPFE so as to produce an amplified phase-compensated focus error signal SAPFE.

Figure 3:
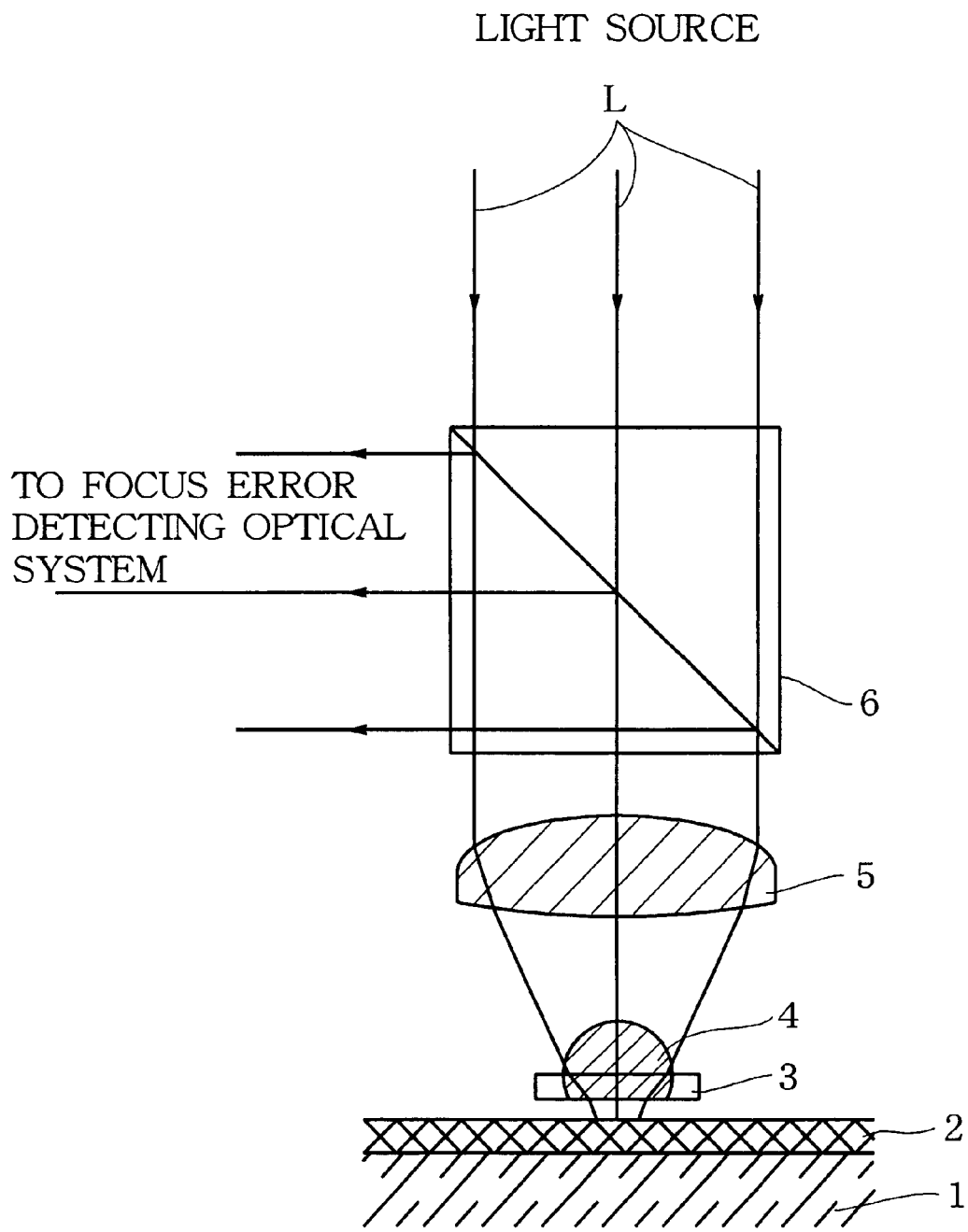
FIG. 3 is an explanatory view indicating the function of a recording head of the recording system shown in FIG. 2.

FIG. 3 illustrates an important portion of the recording head 13.

As shown in FIG. 3, the recording head 13 includes the SIL 4 adapted to further converge a recording beam once converged by an objective lens 5 so as to improve an effective NA (Numerical Aperture), a flying head 3 employing a negative pressure slider adapted to cause the SIL 4 to be upwardly separated from the photoresist layer 2 by a predetermined distance, an objective lens 5 adapted to converge a recording beam from a light source such as a laser diode (not shown), a beam splitter 6 adapted to allow an incident light to be incident onto the glass substrate I and extract a reflection light reflected from the the glass substrate 1.

An exposure process with the use of the above recording system may be described with reference to FIGS. 1b, 1c and FIGS. 2, 3.

At first, the drive motor 11 of the recording system is actuated to rotatably drive the optical disc master plate 10 formed with a photoresist layer 2 having an electrical conductivity, while the sending device 12 is operated to slowly drive the motor 11 in the radial direction of the optical disc master plate 10. As a result, the flying head 3 causes the SIL 4 to be upwardly separated from the photoresist layer 2 by a predetermined distance (about 100 nm).

On the other hand, the recording head 13 is applied with a recording signal SR from an external circuit (not shown), and causes ON/OFF of the recording beam L by virtue of an optical modulator (not shown). In detail, the recording head 13 is adapted to direct the recording beam L through the beam splitter 6 and lead it into the objective lens 5. A converged recording beam L passing through the objective lens 5 is incident onto the photoresist layer 2 of the glass substrate 1, thereby cutting (recording) information pits on the disc 10 in a spiral array.

At this moment, a reflected light from the optical disc master plate 10 is passed through the beam splitter 6 and outputted to the head amplifier 14. The head amplifier 14 is used to amplify the focus servo signal SFCS so as to obtain an amplified focus servo signal SAFCS to be fed to the focus matrix circuit 15. The focus matrix circuit 15 is adapted to generate a focus error signal SFE in accordance with the amplified focus servo signal SAFCS, the generated focus error signal SFE is then applied to the phase compensation circuit 16.

The phase compensation circuit 16 is adapted to compensate the phase of the focus error signal SFE so as to produce a phase-compensated focus error signal SPFE to the amplifier 17. The amplifier 17 is used to amplify the phase-compensated focus error signal SPFE so as to produce an amplified phase-compensated focus error signal SAPFE which is to be fed to the recording head 13. In this way, the recording head 13 is able to effect a focus control on the objective lens 4 by virtue of an actuator (not shown).

Then, as shown in FIG. 1d, a developing treatment is performed so as to obtain an optical disc master plate on which a plurality of information pits have been spirally formed. Afterwards, the master disc is washed with super pure water and is dried in a manner of spin drying, followed by postbaking treatment so as to further remove moisture and ensure an exact adhesion of the photoresist layer 2 to the glass substrate 1.

At this moment, since the surface of the obtained optical disc master plate is not electrically conductive, it is necessary to form an electrically conductive film on the surface of the disc, so that an electrocasting may be performed in a process of making stamper after the formation of the disc master plate. In practice, as a method for forming an electrically conductive film, it is allowed to use vacuum vapor metal deposition, sputterring (dry type) or electroless plating (wet type). On the other hand, as a material for forming the electrically conductive film, it is allowed to use nickel or silver.

Then, a master disc reproducing device is used to check if there is any defect on the surface of the optical disc master plate and any defect in the signal quality thereof.

An optical disc master plate having passed such checking process, is used to prepare a stamper which is in turn used to manufacture the optical disc in large quantity.

Figure 4:
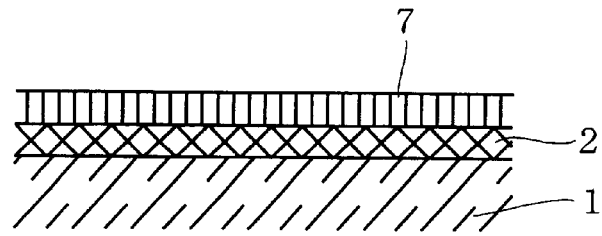
FIGS. 4a–4c are explanatory views indicating several important steps of a method for manufacturing an optical disc master plate, according to a second embodiment of the present invention.
Figure 4:
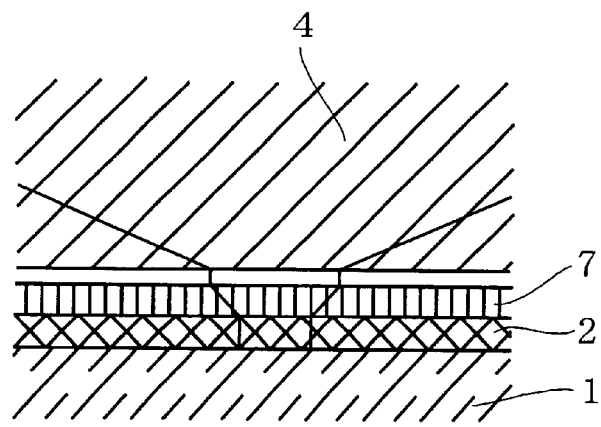
Figure 4:
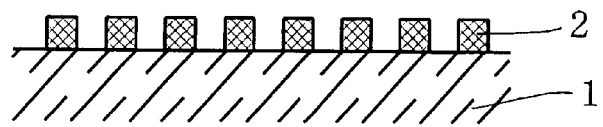

FIG. 4 is used to illustrate a process for manufacturing an optical disc master plate in a method according to a second embodiment of the resent invention.

One difference between the method of the second embodiment and the method of the first embodiment is that a photobleachable dye layer 7 is formed on the photoresist layer 2.

Similar to the method of the first embodiment, after a glass substrate is formed into a predetermined configuration, polished and washed, a photoresist layer 2 is formed on the glass substrate as shown in FIG. 4a. However, unlike the method of the first embodiment, the photoresist layer 2 does not contain any electrically conductive fillers or antistatic agent.

A process of forming the photobleachable dye layer 7 will be described with reference to FIG. 4b: As shown in FIG. 4b, a photobleachable dye layer 7 containing an electrically conductive filler or an antistatic agent is formed on the photoresist layer 2.

To form the photobleachable dye layer 7, a spinner is used to apply a photobleachable material to the photoresist layer 2. At this time, in order to avoid mutual mixing between the photoresist layer 2 and the photobleachable dye layer 7, it is preferred that a barrier coat layer is formed between the two layers 2 and 7.

Figure 5:
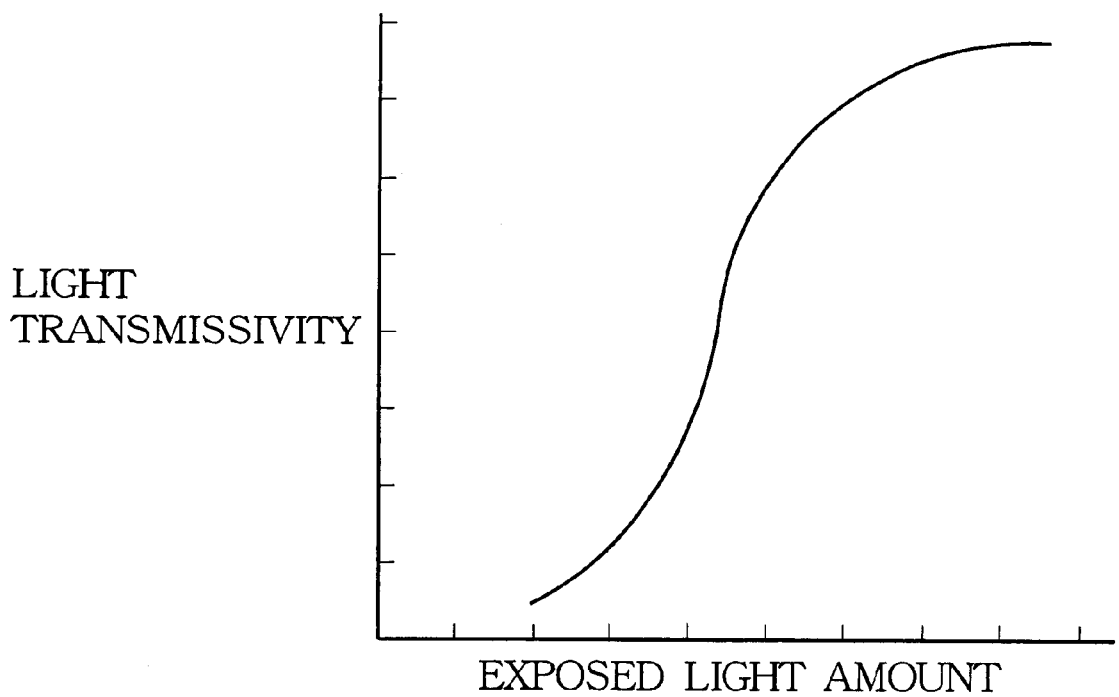
FIG. 5 is a graph indicating a relationship between a light transmissivity and an exposed light amount when a photobleachable material is exposed.

In more detail, the photobleachable material has a non-linear optical characteristic shown in FIG. 5 which indicates that the intensity of a transmitted light changes non-linearly with respect to the intensity of an incident light beam (exposed light amount). When a light beam for exposure is caused to irradiate the photoresist layer 2 through such photobleachable dye layer 7, it is sure that the diameter of a beam spot on the photoresist layer 2 may be converged effectively. Namely, relatively weak portions of an incident light beam are absorbed, obtaining a beam spot having a smaller diameter.

Figure 6B:
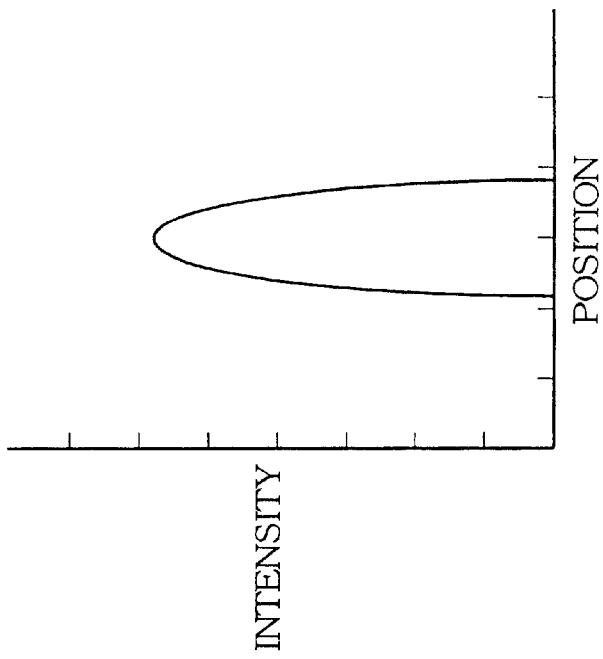
FIGS. 6a and 6b are graphs indicating the intensity distributions of light beams before and after passing through a photobleachable material.
Figure 6A:
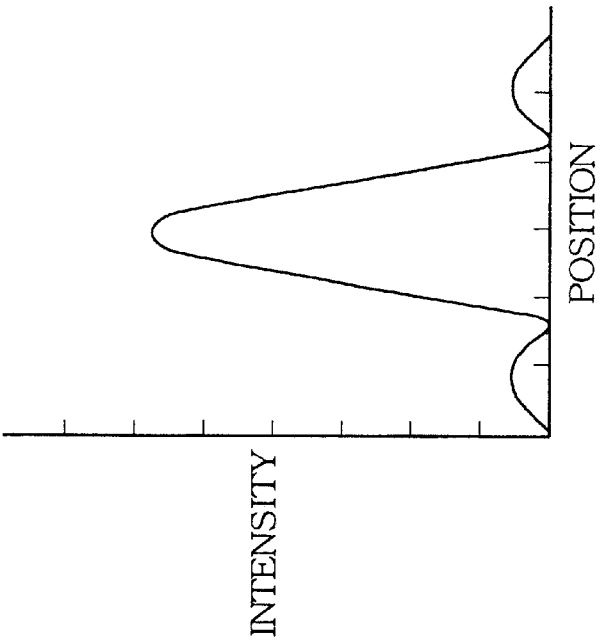
Figure 7:
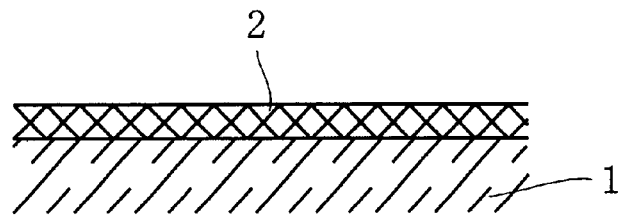
FIGS. 7a–7c are explanatory views indicating several steps of a method for manufacturing an optical disc master plate, according to a prior art.
Figure 7:
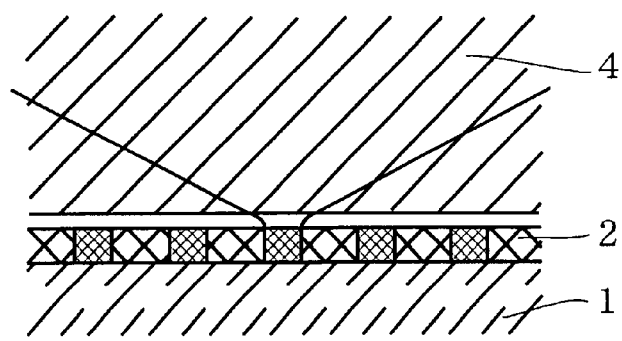
Figure 7:
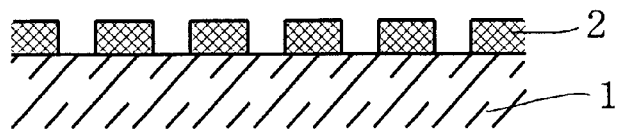
Figure 8:
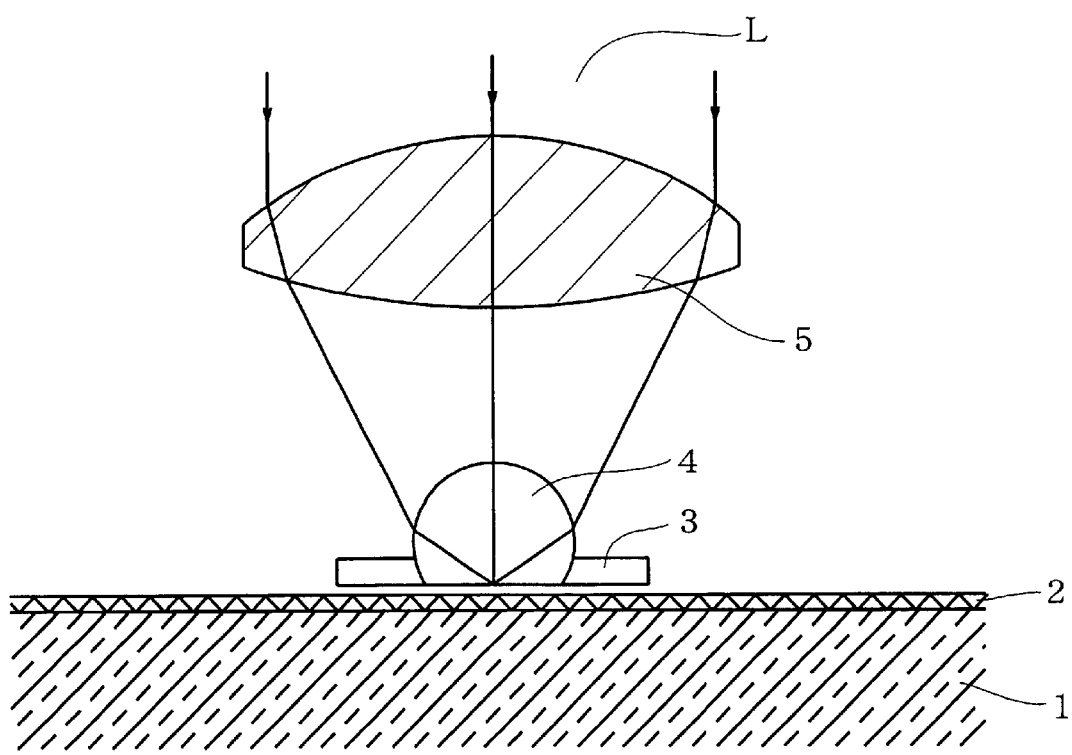
FIG. 8 is an explanatory view indicating the function of a recording head of a recording system of a prior art.
Figure 9:
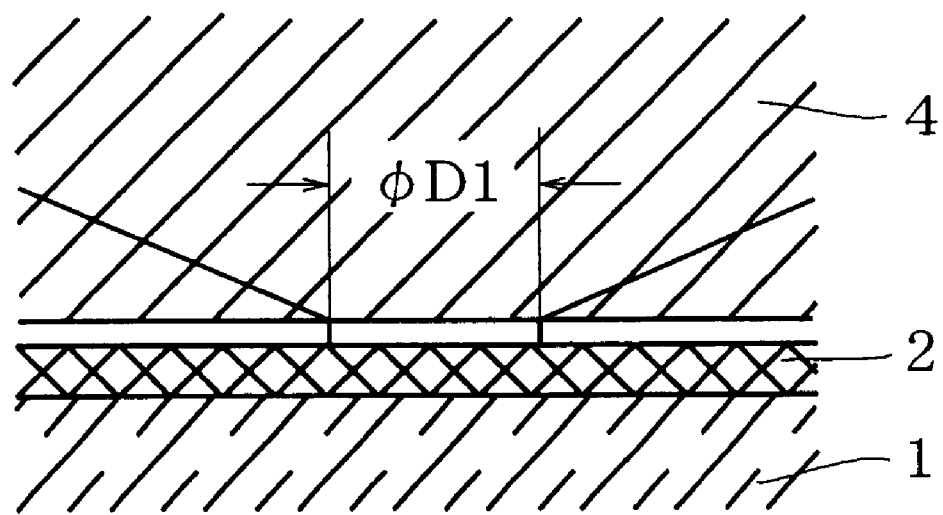
FIG. 9 is an explanatory view indicating an exposure treatment according to a prior art.

FIG. 6a indicates an intensity distribution of an incident light beam enterring the photobleachable dye layer, with a horizontal axis indicating relative distance on a straight line passing through the center of a light beam and parallel with the photobleachable dye layer. FIG. 6b is used to represent an intensity distribution of an light beam exiting from the photobleachable dye layer. As can be understood from a comparison between FIGS. 6a and 6b, since relatively weak edge portions of a converged laser beam are absorbed and only strong central portions thereof are allowed to pass through the photobleachable dye layer, it is sure to reduce the diameter of the beam spot so as to improve a desired resolution, thereby ensuring a high recording density.

What can be used as a photobleachable material may be an arylnitronic compound, such as α-(4-diethylaminophenyl)-N-phenylnitron, α-(4-diethylaminophenyl)-N-(3,4-dichlorophenyl)nitron, α-(4-diethylaminophenyl)-N-(4-acetylphenyl)nitron, α-(4-diethylaminophenyl)-N-(4-etoxycarbonylphenyl)nitron, α-(9-uroryginyl)-N-phenylnitron, α-(9-uroryginyl)-N-(4- chlorophenyl)nitron, α-(4-diethylaminophenyl)-N-(4-cyanophenyl)nitron, α-[p-(diethylamino)styryl]-N-phenylnitron, α-[o-(methoxy)styryl]N-phenylnitron, α-[p-(diethylamino)styryl]-N-(alkylphenyl)nitron, α-[p-(diethylamino)styryl]-N-(alkylphenyl)nitron, α-[p-(diethylamino)phenyl]-N-[1-(2-alkylnaphthyl)]nitron.

Further, it also possible to use 2-(4-hydroxy phenylazo) benzonic acid, 4-phenylazo phenol, 3-methyl-5-(4-sulfophenyl azo)salicylic acid.

Finally, similar to the method of the first embodiment, the glass substrate 1 having formed thereon a photobleachable dye layer 7, is subjected to exposure treatment, developing treatment, surface conductorization treatment, master disc reproducing checking process, thereby obtaining a completed optical disc master plate.

As can be understood from the above description, since the photoresist layer close to the SIL 4 is provided with an electric conductivity, or since the photoresist layer adjacent to the SIL 4 is provided with a further layer consisting of an electrically conductive material or an antistatic agent, an undesired force caused by a static electricity can be prevented between the photoresist layer and the SIL4, thereby ensuring the SIL 4 to be maintained under a stabilized condition, and preventing the dust or small rubbish from adhering to the optical disc master plate.

While the presently preferred embodiments of the this invention have been shown and described above, it is to be understood that these disclosures are for the purpose of illustration and that various changes and modifications may be made without departing from the scope of the invention as set forth in the appended claims.

What is claimed is:

1. A method of manufacturing an optical disc master plate, comprising the steps of:

forming a photoresist layer having an electrical conductivity on a substrate; and irradiating the photoresist layer with a laser beam, using an optical system with a solid immersion lens held on a flying head;

wherein the photoresist layer is formed by a photoresist material containing an electrically conductive material or an antistatic agent.

2. A method of manufacturing an optical disc master plate, comprising the steps of:

forming a photoresist layer on a substrate;

coating the photoresist layer with an electrically conductive material or an antistatic agent; and irradiating the photoresist layer with a laser beam, using an optical system with a solid immersion lens held on a flying head.

3. A method of manufacturing an optical disc master plate, comprising the steps of:

forming a photoresist layer on a substrate;

forming on the photoresist layer a photobleachable dye layer having a predetermined electrical conductivity;

irradiating the photoresist layer with a laser beam, using an optical system with a solid immersion lens held on a flying head;

wherein the photobleachable dye layer is formed by a photobleachable material containing an electrically conductive material or an antistatic agent.

4. A method according to claim 3, wherein the photobleachable dye layer has a volume inherent resistance which is less than 10 Ωcm.

5. A method of manufacturing an optical disc master plate, comprising the steps of:

forming a photoresist layer on a substrate;

forming a photobleachable dye layer on the photoresist layer;

coating the photobleachable dye layer with an electrically conductive material or an antistatic agent; and irradiating the photoresist layer with a laser beam, using an optical system with a solid immersion lens held on a flying head.

* * * * *